United States Patent
Liu et al.

(10) Patent No.: US 9,461,161 B1
(45) Date of Patent: *Oct. 4, 2016

(54) MEMORY ELEMENT CIRCUITRY WITH MINIMUM OXIDE DEFINITION WIDTH

(71) Applicant: Altera Corporation, San Jose, CA (US)

(72) Inventors: Jun Liu, Milpitas, CA (US); Qi Xiang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/165,103

(22) Filed: Jan. 27, 2014

Related U.S. Application Data

(63) Continuation of application No. 13/072,530, filed on Mar. 25, 2011, now Pat. No. 8,649,209.

(51) Int. Cl.
*G11C 11/00* (2006.01)
*H01L 29/78* (2006.01)

(52) U.S. Cl.
CPC .................................. *H01L 29/78* (2013.01)

(58) Field of Classification Search
CPC .............................. G11C 11/00; H01L 29/78
USPC ...................... 365/154; 438/400, 618, 168
See application file for complete search history.

(56) References Cited

U.S. PATENT DOCUMENTS

| | | | |
|---|---|---|---|
| 5,703,392 A | 12/1997 | Guo | |
| 5,923,965 A * | 7/1999 | Dennison | H01L 27/11 257/E21.413 |
| 6,687,145 B2 | 2/2004 | Houston | |
| 6,867,433 B2 * | 3/2005 | Yeo et al. | 257/67 |
| 7,002,203 B2 * | 2/2006 | Mori et al. | 257/314 |
| 7,335,583 B2 * | 2/2008 | Chang | 438/618 |
| 7,446,015 B2 | 11/2008 | Okuno et al. | |
| 7,456,476 B2 * | 11/2008 | Hareland et al. | 257/349 |
| 7,738,282 B2 * | 6/2010 | Liaw | 365/154 |
| 7,768,818 B1 | 8/2010 | Chan et al. | |
| 7,872,903 B2 | 1/2011 | Pederson | |
| 8,138,797 B1 | 3/2012 | Liu et al. | |
| 8,218,353 B1 | 7/2012 | Liu et al. | |
| 2012/0001197 A1 | 1/2012 | Liaw et al. | |

* cited by examiner

*Primary Examiner* — Hoai V Ho
*Assistant Examiner* — Tri Hoang
(74) *Attorney, Agent, or Firm* — Treyz Law Group; Jason Tsai; Vineet Dixit

(57) ABSTRACT

Integrated circuits with memory circuitry are provided. The memory circuitry may include memory cell transistors and associated pass transistors. The memory cell transistors and the pass transistors may be formed using multiple strips of oxide definition (OD) regions coupled in parallel. The multiple OD strips may have reduced widths. The ratio of the distance from adjacent OD strips to a given OD strip to the width of the given OD strip may be at least 0.5. Forming memory circuitry transistors using this multi-strip arrangement may provide increased levels of stress that improve transistor performance. Each OD strip may have a reduced width that still satisfies fabrication design rules. Forming OD regions having reduced width allows the pass transistors to be overdriven at higher voltage levels to further improve transistor performance.

17 Claims, 9 Drawing Sheets

US 9,461,161 B1

MEMORY ELEMENT CIRCUITRY WITH MINIMUM OXIDE DEFINITION WIDTH

RELATED APPLICATION

This application is a continuation of U.S. Pat. No. 8,649,209, issued Feb. 11, 2014, which is hereby incorporated by reference herein in its entirety. This application claims the benefit of and claims priority to U.S. Pat. No. 8,649,209, issued Feb. 11, 2014.

BACKGROUND

Integrated circuits often contain volatile memory elements. Typical volatile memory elements are based on cross-coupled inverters (latches) and are used to store data. Each memory element can store a single bit of data. In integrated circuits such as programmable integrated circuits, volatile memory elements are used to store configuration data.

Memory elements are typically arranged in arrays. Data may be loaded into the memory elements of an array and may be read from the memory elements of the array using data lines. Once loaded, the output of a memory element in a programmable integrated circuit can serve as a static control signal that is applied to the gate of an associated pass transistor. Blocks of programmable logic can be customized by turning on and off appropriate pass transistors in this way.

To ensure satisfactory high-speed operation, it may be desirable to overdrive the pass transistors. In a typical overdrive scheme, pass transistors are controlled using larger voltage levels than are normally used in powering logic gates (i.e., overdrive voltages are applied to the gates of the pass transistors).

Overdrive voltages may have a maximum voltage level that is limited by a time dependent dielectric breakdown (TDDB) mechanism. TDDB is a charge injection mechanism by which a transistor's gate oxide layer breaks down when the gate of the transistor is driven at elevated voltage levels for extended periods of time. In general, a thinner gate oxide layer breaks down more readily than a thicker gate oxide layer. Pass transistors typically have a gate oxide layer with minimum thickness. As a result, the maximum overdrive voltage that may be applied to the pass transistors cannot be much higher than the voltage that is used to power the logic gates, thereby limiting the performance of the pass transistors.

SUMMARY

Integrated circuits may include memory element circuitry. The memory element circuitry may include memory cells (e.g., configuration random-access memory cells, static random-access memory cells, and other types of memory cells) and associated pass transistors.

A memory cell may include at least two pairs of cross-coupled inverters that form a latching circuit. The latching circuit may be accessed during read/write operations using address transistors.

An address transistor may be formed by forming a gate structure over multiple strips of oxide definition (OD) regions. For example, an address transistor may include a conductive gate structure formed over first, second, and third OD strips. The first, second, and third OD strips may be coupled in parallel. The first, second, and third OD strips may have reduced widths that satisfy design rules associated with the fabrication process used to manufacture the integrated circuit. It is appreciated that in one embodiment the width may be a minimum width that satisfies the design rules.

The second OD strip may be interposed between the first and third OD strips. The distance (gap) between the first and second OD strips and the distance between the second and third OD strips may be equal to a given distance. The ratio of the given distance to the width of the second OD strip may be at least greater than 0.5 (as an example). Forming transistors using this configuration induces additional stress in the direction parallel to the length of the gate structure, thereby enhancing the performance of the address transistor.

A pass transistor may be formed by forming a gate structure over multiple strips of OD regions. For example, a pass transistor may include a conductive gate structure formed over at least first, second, and third OD strips. The first, second, and third OD strips may be coupled in parallel. The first, second, and third OD strips may each have reduced widths that satisfy fabrication design rules.

The second OD strip of the pass transistor may be interposed between the first and third OD strips of the pass transistor. The distance (spacing) between the first and second OD strips and the distance between the second and third OD strips may be equal to a given distance. The ratio of the given distance to the width of the second OD strip may be at least greater than 0.8 (as an example). Forming transistors using this configuration induces additional stress in the direction parallel to the length of the gate structure, thereby enhancing the performance of the pass transistor.

Forming OD strips with reduced width also enables the pass transistor to be driven using higher overdrive voltages. This is because the pass transistor has a gate insulating layer with increased thickness at the edges of the transistor channel. The increased thickness allows the pass transistor to withstand higher levels of stress before suffering from dielectric breakdown. Driving pass gates with higher overdrive voltages may provide increased performance.

Further features of the present invention, its nature and various advantages will be more apparent from the accompanying drawings and the following detailed description.

DETAILED DESCRIPTION

Integrated circuits often include arrays of volatile memory elements. These memory element arrays can be used to store data during data processing operations. In programmable integrated circuits such as programmable logic devices, arrays of memory elements may be loaded with configuration data that is used in configuring programmable logic circuitry. Memory cells that are used in storing configuration data for programmable integrated circuits are sometimes referred to as configuration random-access memory (CRAM) cells. Memory cells used in other types of random-access memory (RAM) arrays are sometimes referred to as RAM cells.

The memory elements can be used in any suitable integrated circuits that use memory. These integrated circuits may be memory chips, digital signal processing circuits with memory arrays, microprocessors, application specific integrated circuits with memory arrays, programmable integrated circuits such as programmable logic device integrated circuits in which memory elements are used for configuration memory, or any other suitable integrated circuit. For clarity, the embodiments of the present invention may sometimes be described in the context of programmable logic device integrated circuits. This is, however, merely illustrative and not intended to limit the scope of the present invention. Memory cells in accordance with embodiments of the present invention may be used in any suitable circuits. On integrated circuits such as memory chips or other circuits in which memory is needed to store processing data, the memory elements may perform the functions of static random-access memory (RAM) cells and are sometimes referred to as SRAM cells. In the context of programmable logic device integrated circuits, the memory elements can be used to store configuration data and are therefore sometimes referred to in this context as configuration random-access memory (CRAM) cells.

Figure 1:
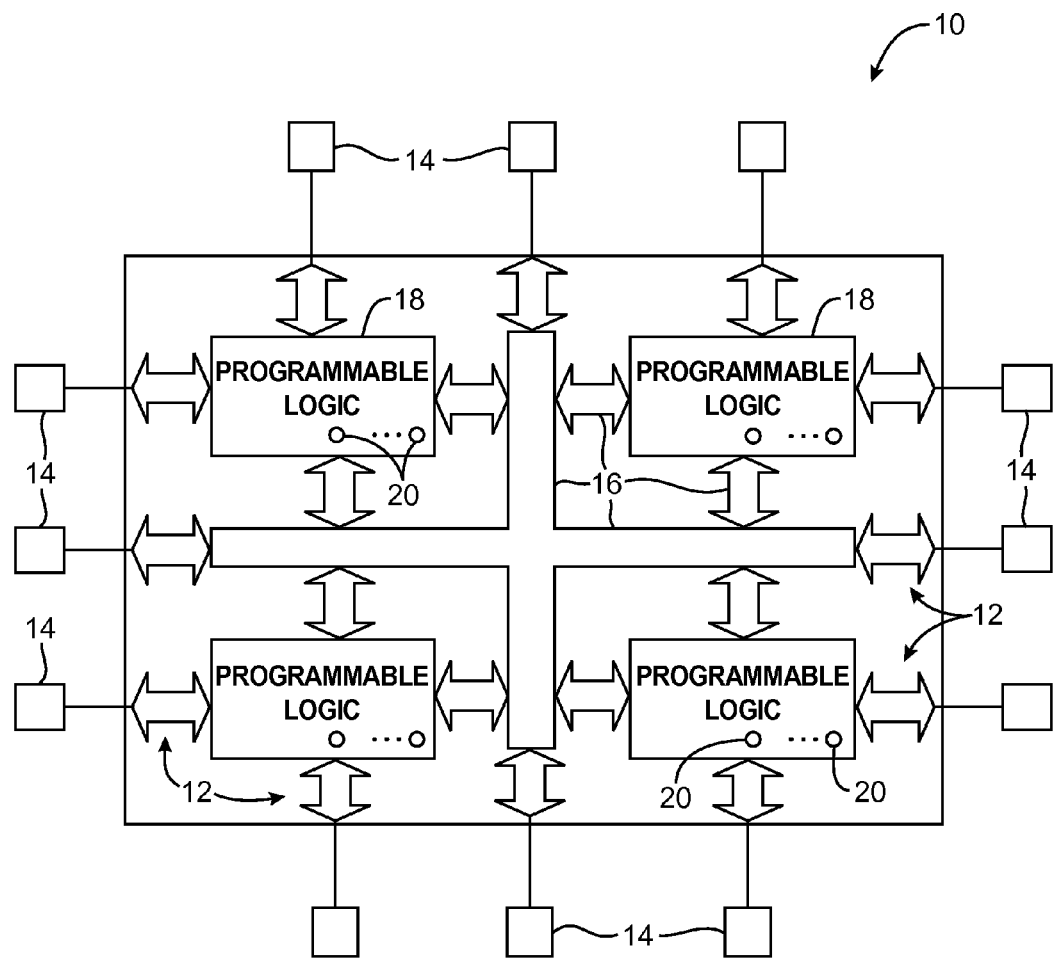
FIG. 1 is a diagram of an illustrative integrated circuit comprising random-access memory cells in accordance with an embodiment of the present invention.

An illustrative integrated circuit 10 comprising memory is shown in FIG. 1. Device 10 may have input/output (I/O) circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains volatile memory elements 20 that can be loaded with configuration data (also called programming data) using pins 14 and input/output circuitry 12. Once loaded, the memory elements can provide corresponding static control output signals that control the state of an associated logic component in programmable logic 18. If desired, memory elements 20 may be used in SRAM-type memory arrays (e.g., to store data for processing circuitry during operation of device 10).

Memory element 20 may be formed from a number of transistors configured to form a bistable circuit. With one suitable approach, complementary metal-oxide-semiconductor (CMOS) integrated circuit technology is used to form memory element 20, so CMOS-based memory element implementations are described herein as an example. If desired, other integrated circuit technologies may be used to form the memory elements and the integrated circuit in which the memory elements are used to form memory arrays.

The memory elements may be loaded from an external erasable-programmable read-only memory and control chip or other suitable data source via pins 14 and input/output circuitry 12. Loaded CRAM memory elements 20 may provide static control signals that are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18. The circuit elements may be transistors such as pass transistors, parts of multiplexers, look-up tables, logic arrays, AND, OR, NAND, and NOR logic gates, etc.

The memory elements 20 may be arranged in an array pattern. In a typical modern programmable logic device, there may be millions of memory elements 20 on chip 10. During programming operations, the array of memory elements is provided with configuration data by a user (e.g., a logic designer). Once loaded with configuration data, the memory elements 20 selectively control portions of the circuitry in the programmable logic 18 and thereby customize its functions so that it will operate as desired.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

When memory elements 20 are arranged in an array, horizontal and vertical conductors and associated control circuitry may be used to access the memory elements. The control circuitry may, for example, be used to clear all or some of the memory elements. The control circuitry may also write data into the memory elements and may read data from the memory elements. For example, in CRAM arrays, memory elements may be loaded with configuration data. Loaded configuration data may then be read out from the array to confirm proper data loading operations before device 10 is used during normal operation in a system.

Figure 2:
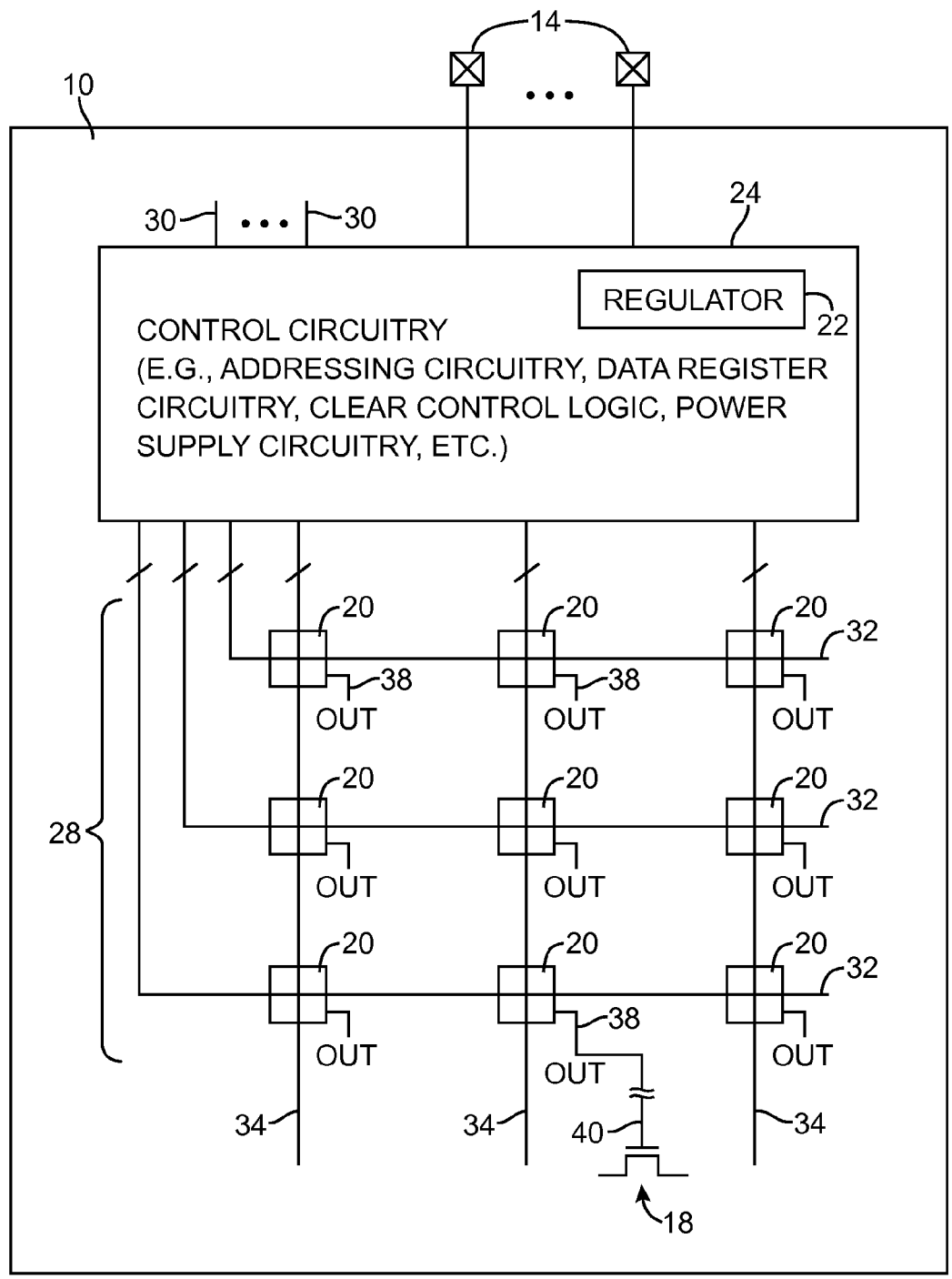
FIG. 2 is a diagram of an illustrative array of memory cells in accordance with an embodiment of the present invention.

Any suitable memory array architecture may be used for memory elements 20. One suitable arrangement is shown in FIG. 2. As shown in FIG. 2, there may be an array 28 of memory elements 20 in device 10. There are only three rows and columns of elements 20 in the illustrative array of FIG. 2, but in general there may be hundreds or thousands of rows and columns in array 28. Array 28 may be one of a number of arrays on a given device 10, may be a subarray that is part of a larger array, or may be any other suitable group of memory elements 20. Memory element 20 may supply a corresponding output signal OUT at a corresponding output path 38. In CRAM arrays, signal OUT may be a static output control signal that may be conveyed over a path 40 and used in configuring a corresponding transistor such as transistor 18 or other circuit element in associated programmable logic 18.

Integrated circuit 10 may have control circuitry 24 for supplying signals to memory elements 20 in memory array 28. Control circuitry 24 may receive power supply voltages, data, and other signals from external sources using pins 14 and from internal sources using paths such as paths 30. Control circuitry 24 may include circuitry such as an adjustable voltage supply (regulator 22), address decoder circuitry, address register circuitry, data register circuitry, and clear control circuitry. Regulator 22 may be used to produce time-varying power supply voltages. These power supply voltages may be of the same magnitude as the voltages received on pins 14 or may have different magnitudes than the voltage received from pins 14. Control circuitry 24 (e.g., the addressing circuitry, data register circuitry, clear control circuitry, and other control circuitry of circuitry 24) can use the power supply voltages supplied by pins 14 and by regulator 22 to produce desired time-varying and fixed signals on paths such as paths 32 and 34.

There may, in general, be any suitable number of conductive lines associated with paths 32 and 34. For example, each row of array 28 may have a single associated address line (or word line) in a respective one of paths 32 that carries a corresponding address signal (as an example). Each column of array 28 may include a respective path 34 in which corresponding bit lines are used to convey read and write data signals.

A clear signal may be routed to at least some of the cells in array 28 simultaneously over a common clear line. The clear line may be oriented horizontally so that there is one branch of the clear line in path 32 or may be oriented vertically so that there is one branch of the clear line in path 34. Power can also be distributed in this type of global fashion. For example, a positive power supply voltage (sometimes referred to as Vcc) may be supplied in parallel to cell 20 using a pattern of shared horizontal or vertical conductors. A ground voltage Vss may likewise be supplied in parallel to the cells 20 using a pattern of shared horizontal or vertical lines. Address lines and data lines are typically orthogonal to each other (i.e., address lines are horizontal while data lines are vertical or vice versa). If desired, other patterns of lines may be used in paths 32 and 34 (e.g., different numbers of power supply signals, data signals, and address signals may be used).

The signals that are supplied to memory elements 20 may sometimes be collectively referred to as control signals. In particular contexts, some of these signals may be referred to as power signals, clear signals, data signals, address signals, etc. These different signal types are not mutually exclusive. Circuitry 24 may control clearing operations, data loading operations, and read operations for array 28.

In preparation for data loading operations, circuitry 24 may clear array 28. In one embodiment, the clear operation may take the contents of memory cell 20 to a known value (i.e., to a logic zero). Once cleared, each OUT signal of the cleared array 28 will be low (i.e., Vss). Circuitry 24 may produce clear signals such as a complementary clear signal and/or a true clear signal that are used in clearing operations. When clearing a CRAM array, all clear lines associated with the CRAM array of a given type (e.g., all complementary clear lines in an array that is cleared using only complementary clear lines) may be commonly controlled. In this way, the clear signals may be asserted and deasserted simultaneously for all cells in the CRAM array or any portion thereof. This type of global clear operation can help to reduce clear times. If desired, clear signals can be asserted individually for different groups of cells. Clearing operations for CRAM arrays are typically performed upon system power-up or during reconfiguration.

After array 28 has been cleared, circuitry 24 may load data into array 28. Circuitry 24 may receive data such as configuration data from external sources via input path 30. In a typical programmable logic device system, configuration data is loaded into a programmable logic device from a memory and data loading circuit. This type of circuit, which is sometimes referred to as a configuration device, loads configuration data into registers within circuitry 24. Address decoder circuits in circuitry 24 may receive external control signals or addressing control signals can be generated internally in circuitry 24. Address signals can be controlled independently in each row (or in column-based addressing schemes, in each column).

Configuration data may be loaded into registers in circuitry 24 in series. These registers may then apply the configuration data in parallel to array 28 via data lines (e.g., true data lines, complementary data lines, or both true and complementary data lines). Address decoder circuitry in circuitry 24 can receive addressing information via input 30. The address decoder circuitry can then systematically assert desired address lines 32. As the address line in a selected row is asserted (i.e., as the signal ADD in a given row is taken high), the data on the data lines 34 is loaded into the memory elements 20 in that column (e.g., data bits are written into memory elements 20). By addressing selected rows in this way, the array 28 may be loaded with configuration data. After the array has been loaded, the output 38 of memory element 20 may produce a corresponding static control signal for controlling the gate of a pass transistor or other logic component in the programmable logic 18 of the programmable logic device 10 (FIG. 1).

Control circuitry 24 may perform data read operations on array 28 to confirm that data has been loaded properly. Data reading operations may be performed by systematically asserting desired address lines and monitoring the resulting data on data lines (e.g., using sense amplifier circuitry in circuitry 24).

Figure 3:
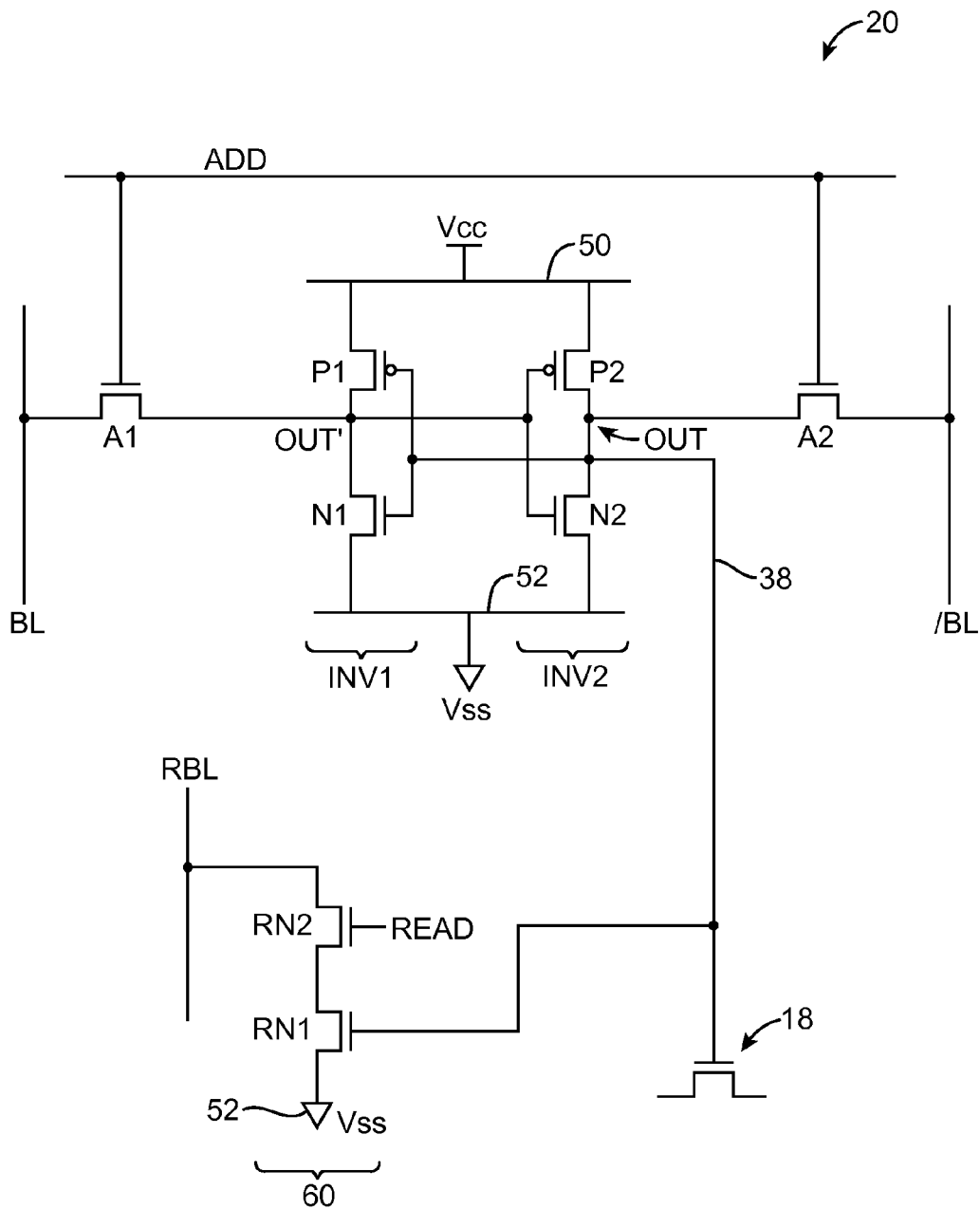
FIG. 3 is a circuit diagram of an illustrative memory cell and an associated pass transistor in accordance with an embodiment of the present invention.

Memory cells 20 may be based on any suitable bistable circuit. An illustrative memory cell circuit that may be used for memory cells 20 is shown in FIG. 3. In the illustrative example of FIG. 3, memory cell 20 is based on a pair of cross-coupled inverters. Inverter INV1 has an input and an output. Inverter INV2 has an output (node OUT) that is coupled to the input of inverter INV1 and has an input (node OUT') that is coupled to the output of inverter INV1. Inverter INV1 may include p-channel transistor P1 and n-channel transistor N1 coupled in series between positive power supply line 50 (e.g., a power supply line on which positive power supply voltage Vcc is provided) and ground power supply line 52 (e.g., a ground line on which ground power supply voltage Vss is provided). Inverter INV2 may include p-channel transistor P2 and n-channel transistor N2 coupled in series between power supply lines 50 and 52.

When connected in this way, inverters INV1 and INV2 are said to be cross coupled and form a bistable data storage element. Data can be stored on nodes OUT and OUT'. The states of the logic bits stored on nodes OUT and OUT' are complementary. For example, if node OUT is storing a logic one (i.e., a signal at positive power supply voltage Vcc), node OUT' will be storing a logic zero (i.e., a signal at ground power supply voltage Vss).

The values of Vss and Vcc that are used in powering cell 20 may be selected based on the type of process that is used in manufacturing circuit 10. As an example, Vcc might be 0.85 volts and Vss might be 0 volts. Other voltage levels may be used if desired.

Data may be written into cell 20 using true bit line BL and complementary bit line /BL (sometimes referred to as true and complementary data lines). Address transistors (or access transistors) A1 and A2 may be used in controlling the transfer of data between lines BL and /BL and nodes OUT' and OUT, respectively. The gates of transistors A1 and A2 are controlled by address signal ADD. Address transistor A1 may have a drain connected to BL and a source connected to node OUT', whereas address transistor A2 may have a drain connected to /BL and a source connected to node OUT.

Data may be read from cell 20 using a read circuit such as read buffer circuit 60 (see, e.g., FIG. 3). As shown in FIG. 3, read buffer 60 may include n-channel read transistors RN1 and RN2 coupled in series between a read bit line RBL and ground line 52. Transistor RN1 may have a gate that is coupled to node OUT, whereas transistor RN2 may have a gate that is controlled by control signal READ.

Line RBL may be precharged to a high voltage level. During read operations, signal READ is asserted to enable read buffer circuit 60. If cell 20 is storing a logic one (i.e., node OUT is high), RBL will discharge towards Vss. If cell 20 is storing a logic zero (i.e., node OUT is low), RBL will remain charged at Vcc (as an example).

Once loaded with data, (e.g., once node OUT has been loaded with a desired logic value), a corresponding control signal (having the value of the data bit loaded on node OUT) may be applied to the gate of transistor 18 over path 38. Transistors such as transistor 18 may also be controlled by control signals from other sources, such as dynamic control signals from logic circuitry on device 10 or external control signals.

Pass transistor performance can be enhanced by increasing Vcc. For example, it may be desirable to elevate the power supply voltage for cells 20, as this may correspondingly elevate the value of the output voltage (signal OUT) on the output lines 38 that are associated with cells 20 (i.e., for those cells that are loaded with a logic one). This elevated output signal may, in turn, help to more aggressively turn on the corresponding pass transistor in programmable logic 18, improving circuit performance.

If desired, elevated logic high voltages and/or reduced ground voltages can be used for data signals, clear signals, and address signals. Whether associated with temporarily altered power supply voltages or temporarily elevated signal strengths for other control signals, these time-varying signal strength enhancement schemes are sometimes referred to as overdrive schemes. The magnitude of the elevated voltages may therefore be referred to as overdrive voltages.

In general, any suitable arrangement may be used for varying signal strengths for array 28 (e.g., time varying power supply levels, temporarily overdrive address signal levels, etc.). These optional signal strength modifications may take place during clear operations in which array 28 is being cleared, during write operations in which data is being written into array 28, during read operations in which data is being read out from array 28, and during normal operation in which signals OUT from a loaded array are being applied to corresponding programmable logic 18.

Memory circuitry performance may be dependent on the arrangement/formation of the memory circuitry transistors (e.g., the address transistors, transistors in the cross-coupled inverters, pass transistor 18, etc.) in an integrated circuit substrate (e.g., a silicon substrate).

Figure 4:
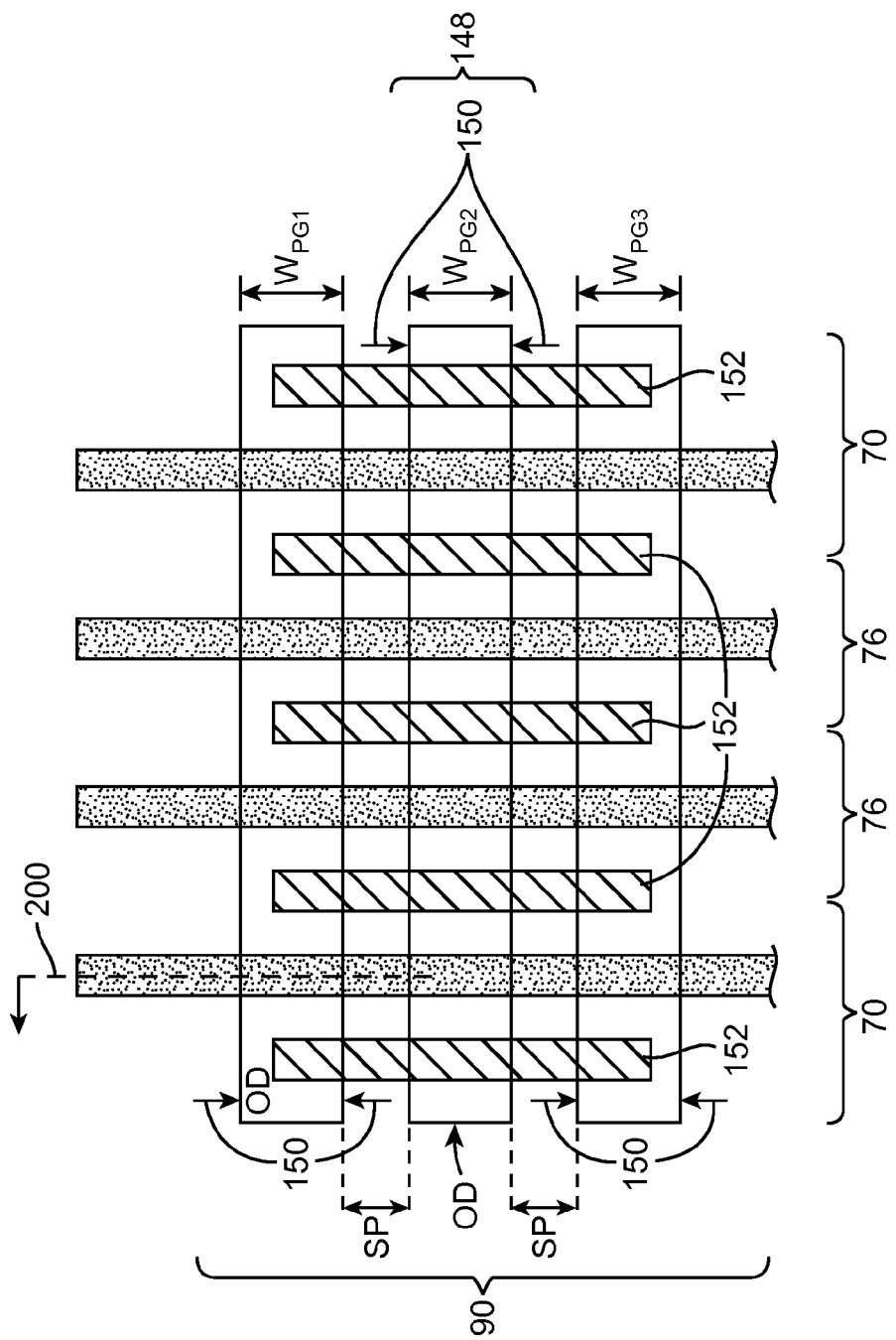
FIG. 4 is a top layout view of a portion of an illustrative pass transistor in accordance with an embodiment of the present invention.

One suitable way of forming pass transistor 18 with increased performance in comparison to a conventional pass transistor is shown in FIG. 4. As shown in FIG. 4, the transistors of region 90 (e.g., transistors 70 and 76) may be formed over three parallel strips of oxide definition (OD) regions (as an example). For example, the first OD strip in region 90 may have OD width $W_{PG1}$, the second OD strip in region 90 may have OD width $W_{PG2}$, and the third OD strip in region 90 may have OD width $W_{PG3}$ (see, e.g., FIG. 4). Widths $W_{PG1}$, $W_{PG2}$, and $W_{PG3}$ may each be equal to the minimum allowable OD width specified by manufacturing design rules (e.g., $W_{PG1}$, $W_{PG2}$, and $W_{PG3}$ may each be equal to 0.1 µm).

The oxide definition regions form source-drain diffusion regions for each transistor (e.g., the portion of OD region to one side of the gate structure forms a drain, whereas the portion of OD region to the other side of the gate structure forms a source). The source-drain regions of transistors 70 and 76 may be coupled in parallel using conductive paths 152, as shown in FIG. 4. For example, pass transistor 18 may have a source that is formed by parts of the parallel doped semiconductor regions and a drain that is formed by parts of the parallel doped semiconductor regions.

Forming pass transistor 18 using the multi-strip arrangement of FIG. 4 may increase the level of stress experienced by transistor 18. Regions in the substrate that are not oxide definition regions may be occupied by shallow trench isolation (STI) structures, field oxide structures, or other types of isolation structures (e.g., portions of isolation structures may be interposed between two adjacent semiconductor doped regions). The STI regions may induce stress in a direction that is parallel to longitudinal axis 200 to compress each OD strip, as indicated by arrows 150 in FIG. 4. Oxide definition regions formed using multiple strips (see, e.g., region 90 in FIG. 4) each having reduced widths experience elevated stress levels compared to oxide definition regions formed using a single continuous strip. Conventional pass transistors are typically formed using a single continuous oxide definition region having a width equal to the sum of the widths of the multiple strips. Compressive stress that is parallel to the length of the gate structures may effectively improve the performance of pass gate 18 (e.g., pass gate 18 may exhibit improved channel mobility and on current). Pass transistor 18 may be formed using at least four parallel doped semiconductor regions, at least nine parallel doped semiconductor regions, etc.

Figure 5:
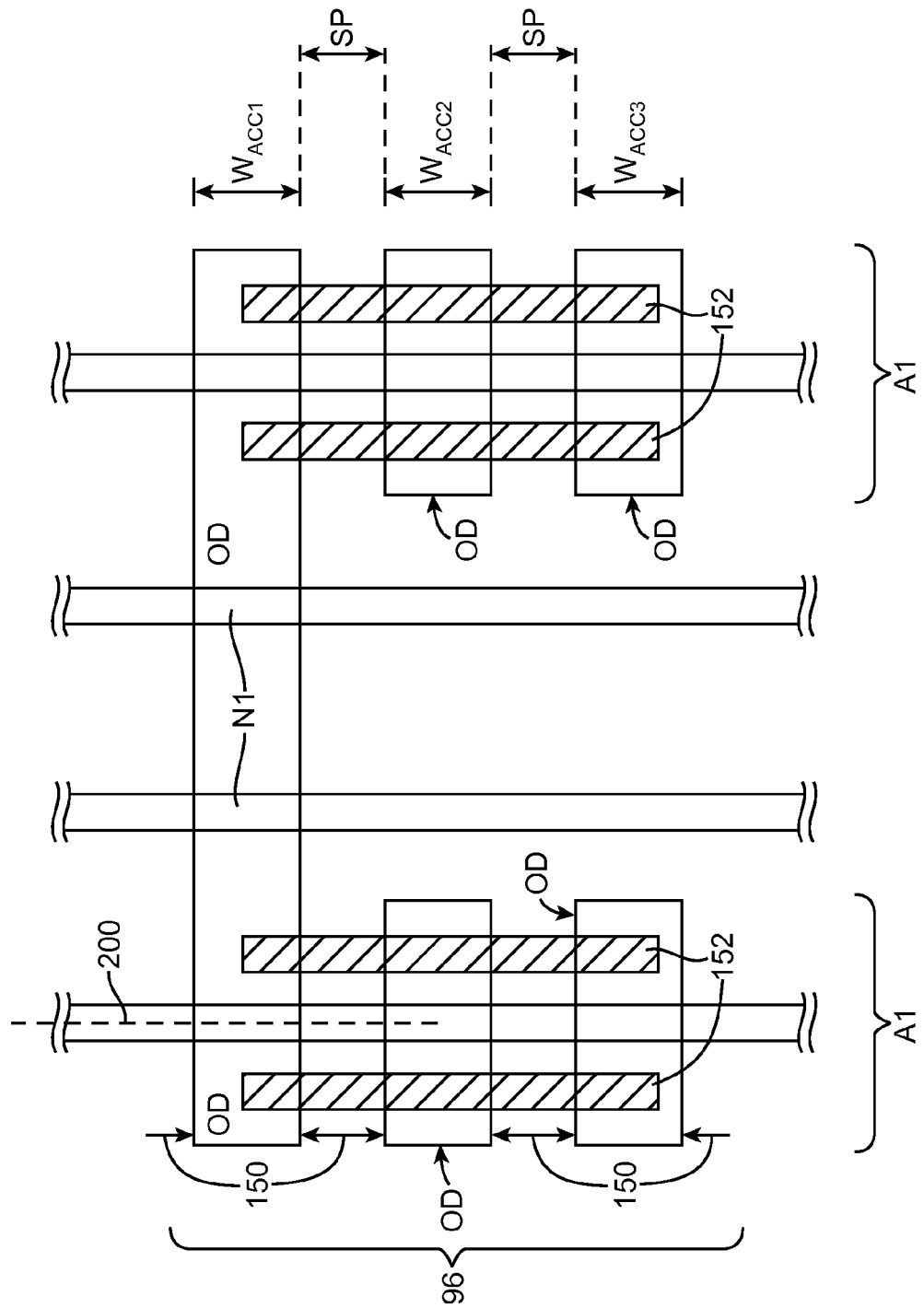
FIG. 5 is a top layout view of illustrative memory circuitry in accordance with an embodiment of the present invention.

One suitable way of forming access transistor A1 with increased performance in comparison to the conventional access transistor is shown in FIG. 5. As shown in FIG. 5, transistor A1 of region 96 may be formed over three parallel strips of oxide definition (OD) regions (as an example). For example, the first OD strip in region 96 may have OD width $W_{ACC1}$, the second OD strip in region 96 may have OD width $W_{ACC2}$, and the third OD strip in region 96 may have OD width $W_{ACC3}$. Widths $W_{ACC1}$, $W_{ACC2}$, and $W_{ACC3}$ may individually be equal to 0.1 µm (as an example). It is, however, appreciated that widths of each OD may also be different from one another. As such, the width of 0.1 µm for each OD width is exemplary and not intended to limit the scope of the present invention. The source-drain regions of transistor A1 may be coupled in parallel using conductive paths 152, as shown in FIG. 5. Transistor A1 may have a source that is formed from parts of the three parallel address transistor doped semiconductor regions and a drain that is formed from parts of the three parallel semiconductor regions. If desired, the address transistor may be formed using at least two parallel strips of doped semiconductor regions.

Forming the access transistors using the multi-strip arrangement of FIG. 5 may increase the level of stress experienced by the access transistor. The STI regions may induce stress in a direction that is parallel to longitudinal axis 200 to compress each oxide definition region, as indicated by arrows 150 in FIG. 5. Oxide definition regions formed using multiple strips (see, e.g., region 96 in FIG. 5) with reduced widths experience elevated stress levels compared to oxide definition regions formed using a single continuous strip. Compressive stress that is parallel to the length of the gate structures may effectively improve the performance of the access transistors (e.g., to help increase the write-ability of cell 20). Similarly, transistor A2 (of FIG. 3) may be formed using the multi-strip arrangement of FIG. 5 to improve cell performance.

Figure 6:
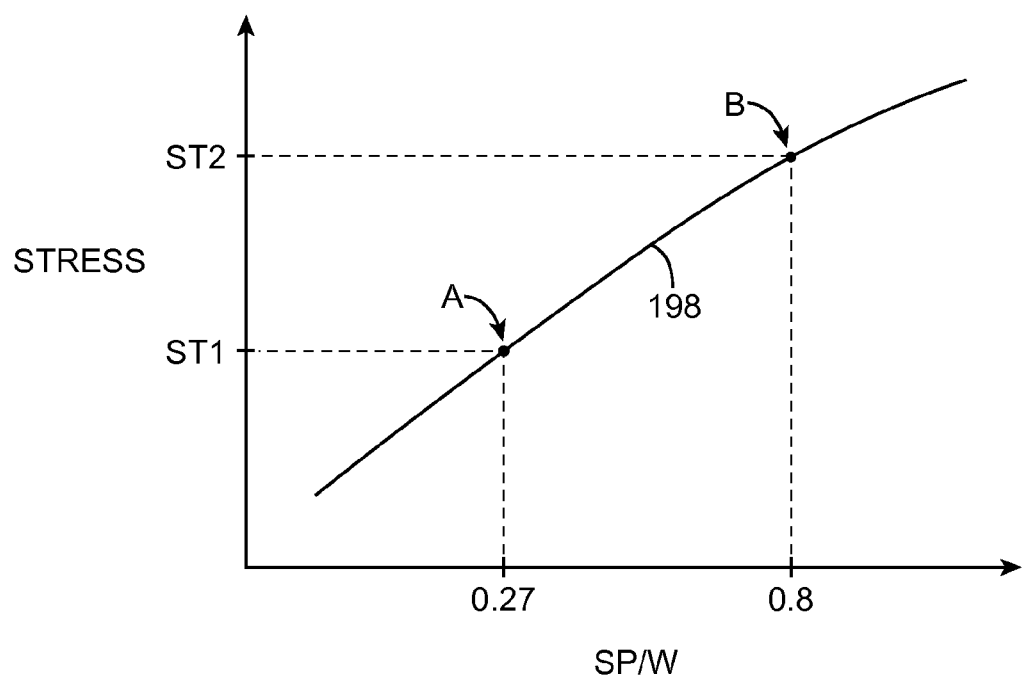
FIG. 6 is an exemplary plot of stress versus the ratio of transistor spacing to transistor width in accordance with an embodiment of the present invention.

The amount of stress that is induced by the STI (isolation) structures may be dependent on a ratio of oxide definition spacing (SP) to oxide definition width (W). FIG. 6 is an exemplary plot showing stress level versus the ratio of SP to W. As shown in FIG. 6, stress characteristic curve 198 maps the relationship between stress and SP/W.

Consider the illustrative transistor arrangement of pass gate 18 in FIG. 4 in which the second oxide definition strip in region 90 is separated from adjacent first and third oxide definition strips by distance SP. Oxide definition width $W_{PG2}$ and spacing SP to adjacent oxide definition strips may be equal to 0.1 μm and 0.08 μm, respectively. The SP/W ratio is therefore approximately equal to 0.8 (0.08 divided by 0.1), as indicated by point B on line 198. An SP-to-W ratio of 0.8 may correspond to a second stress level ST2. Stress level ST2 may be greater than stress level ST1 characteristic of conventional pass gate transistors and conventional access transistors. Pass gate transistors (of FIG. 4) experiencing stress level ST2 may therefore exhibit higher performance relative to conventional pass gate transistors experiencing stress level ST1. It may be desirable to have SP/W be greater than 0.4, greater than 0.7, etc.

Consider the illustrative transistor arrangement of the access transistors in FIG. 5 in which the second oxide definition strip in region 96 is separated from adjacent first and third oxide definition strips by distance SP. Oxide definition width $W_{ACC2}$ and spacing SP to adjacent oxide definition strips may be equal to 0.1 μm and 0.08 μm, respectively. The SP/W ratio is therefore approximately equal to 0.8 (0.08 divided by 0.1). An SP-to-W ratio of 0.8 may correspond to second stress level ST2. Access transistors (of FIG. 5) experiencing stress level ST2 may therefore exhibit higher performance relative to conventional access transistors experiencing stress level ST1.

Figure 7:
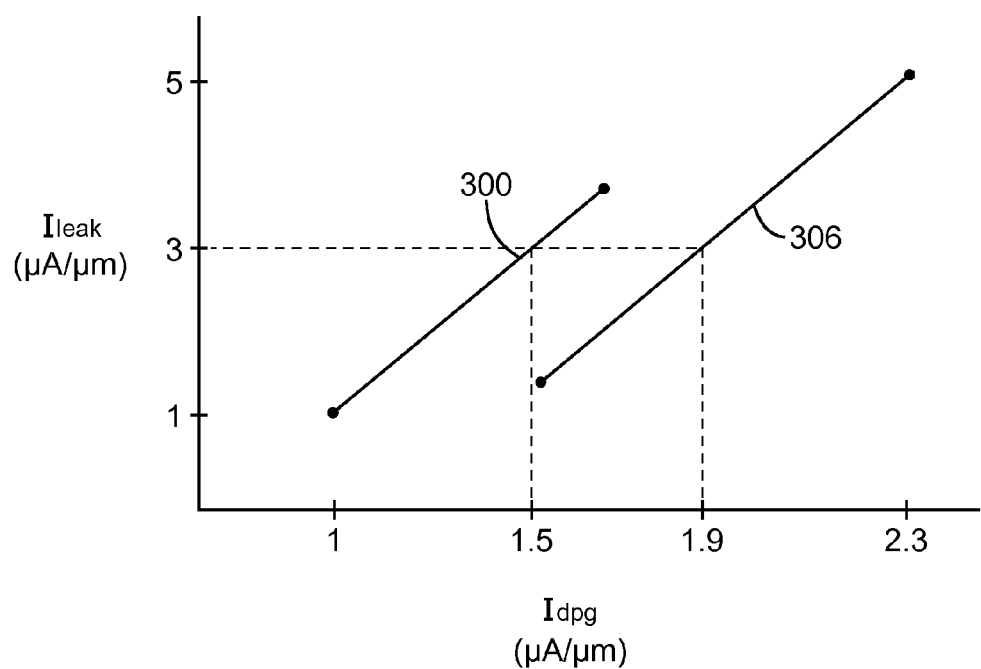
FIG. 7 is an exemplary plot illustrating improved transistor performance at higher stress levels in accordance with an embodiment of the present invention.

The increase in pass gate performance provided as a result of higher levels of stress is illustrated in FIG. 7. FIG. 7 is an exemplary plot showing leakage current Ileak (i.e., a leakage current that flows through a pass transistor when the pass transistor is in an off state) versus drain current Idpg (i.e., a current that flows through a pass transistor when the pass transistor is in an on state).

FIG. 7 includes performance characteristic curves 300 and 306. Curve 300 characterizes the pass gate performance for conventional pass gate transistors having a single continuous strip arrangement, whereas curve 306 characterizes the pass gate performance for pass gate 18 having the reduced-width multi-strip arrangement of the type described in connection with FIG. 4 (e.g., curve 300 is associated with pass transistors that experience a given stress level, whereas curve 306 is associated with pass transistors that experience an elevated stress level that is greater than the given stress level).

Curve 306 may be a shifted version of curve 300. A given leakage current of 3 μA/μm-width may correspond to a Idpg of 1.5 μA/μm-width for curve 300, whereas the given leakage current of 3 μA/μm-width may correspond to a Idpg of 1.9 μA/μm-width for curve 306. Curve 306 may therefore provide increased performance, because pass gate 18 associated with curve 306 provides a higher on current (i.e., 1.9 is greater than 1.5) than conventional pass gate transistors associated with curve 300 for the same level of leakage current per unit width.

Figure 8:
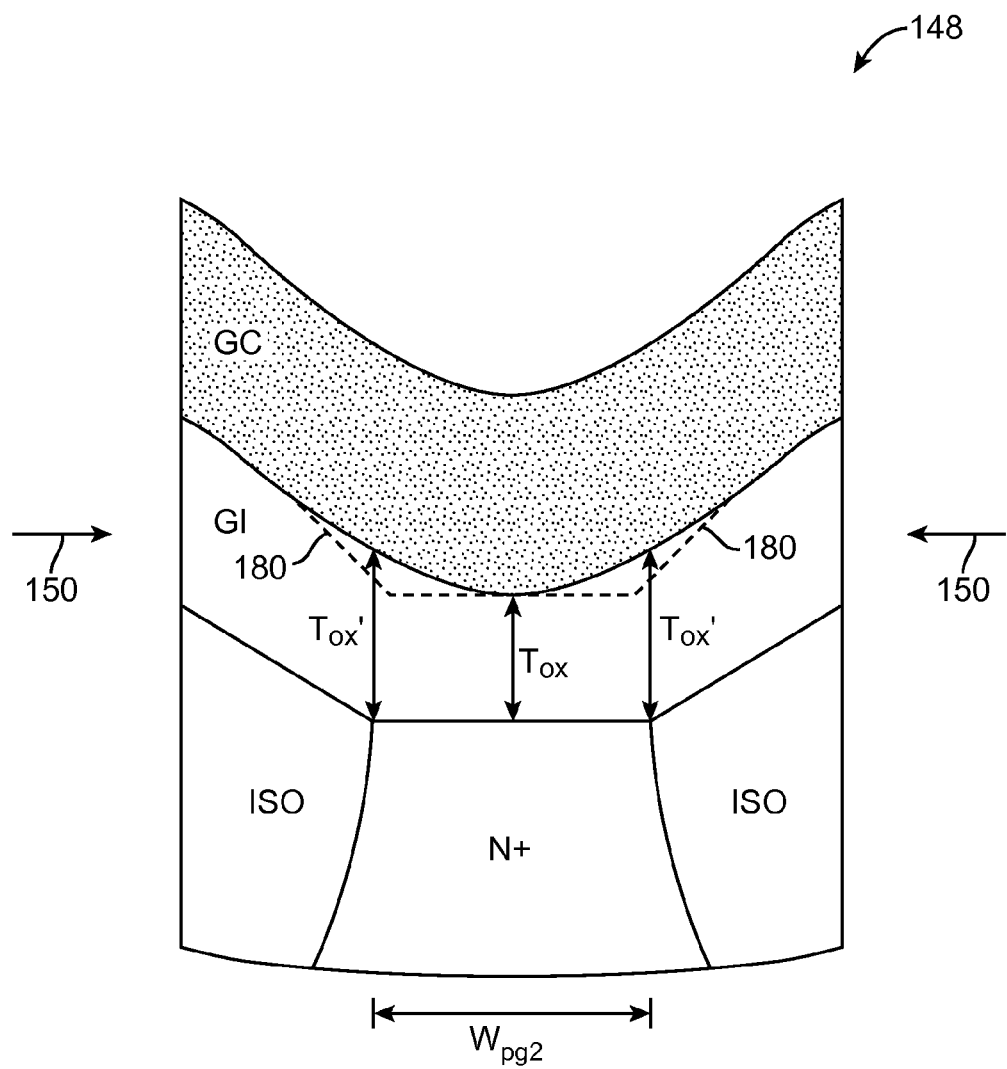
FIG. 8 is an exemplary cross-sectional side of a portion of a pass transistor FIG. 4 with reduced width in accordance with an embodiment of the present invention.

FIG. 8 is an exemplary cross-sectional side view of a pass gate transistor FIG. 4 with reduced width cut along longitudinal axis 200 (see, e.g., FIG. 4). FIG. 8 shows a given strip of oxide definition region (e.g., the second OD strip described in connection with FIG. 4) that experiences compressive stress in the direction as indicated by arrows 150. Region 148 may include an n+ oxide definition region that is formed in the substrate. The second OD strip may be surrounded by isolation structures ISO (e.g., shallow trench isolation structures, field oxide structures, or other types of isolation structures). A layer of gate insulator GI may be formed on the surface of the substrate. A layer of gate conductor GC (e.g., a metal gate structure, a polysilicon gate structure, or other types of gate structures) may be formed over layer GI.

Strip 148 may have oxide definition width $W_{PG2}$ of 0.1 μm (as an example). Gate insulator GI may have a thickness Tox at the center of the oxide definition region (e.g., at the center of a transistor channel), whereas gate insulator GI may have a thickness Tox' at the edges of the oxide definition region (e.g., at the edges of a transistor channel). Layer GI may ideally be formed over the substrate with a profile delineated by dotted line 180. In practice, however, layer GI may be thicker at the interface between the oxide definition region and the isolation region if $W_{PG2}$ has a minimal width of 0.1 μm (e.g., the minimal width that is allowed by fabrication design rules associated with the process that is used to fabricate device 10). For example, Tox may be equal to 12 angstroms, whereas Tox' may be equal to or greater than 13 angstroms.

Pass gate performance is dependent on level of overdrive voltage that can be applied to the gate of a pass transistor. A higher overdrive voltage can more aggressively turn on a pass transistor to improve its performance relative to a lower overdrive voltage. Maximum overdrive voltage Vmax may be defined as the maximum voltage that can be applied to the gate of a pass transistor without the pass transistor suffering from reliability issues such as gate dielectric breakdown (or time dependent dielectric breakdown). It may be desirable to be able to provide higher levels of Vmax.

Figure 9:
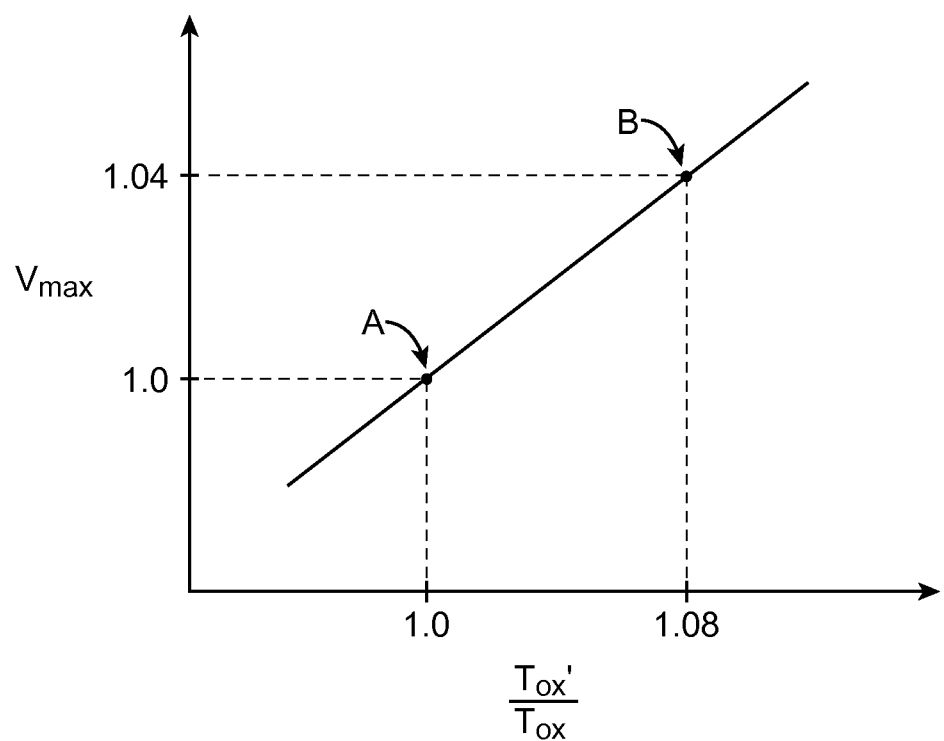
FIG. 9 is an exemplary plot illustrating overdrive voltage level versus the ratio of the gate insulator thickness at the edges of a channel to the gate insulator thickness at the center of the channel in accordance with an embodiment of the present invention.

Maximum overdrive voltage Vmax may be dependent on a ratio of the gate oxide thickness at the edges of a transistor channel to the gate oxide thickness at the center of the transistor channel (e.g., the ratio of Tox' to Tox). FIG. 9 is an exemplary plot showing overdrive voltage Vmax versus Tox'/Tox. For example, the ratio of Tox' to Tox for a conventional transistor formed using a single continuous strip configuration is approximately equal to 1.0 (12.1 divided by 12), whereas the ratio of Tox' to Tox for the transistor arrangement of FIG. 8 (i.e., a transistor formed using a reduced-width multi-strip configuration) is approximately equal to 1.08 (13 divided by 12).

Vmax for conventional pass gates may be equal to 1.0 V (as indicated by point A in FIG. 9), whereas Vmax for pass gate 18 of FIG. 8 may be equal to 1.04 V (as indicated by point B in FIG. 9). The higher Vmax of 1.04 V can be attributed to the increase in gate insulator thickness at the edges of the channel, because thicker dielectric layers are capable of withstanding higher levels of stress before experiencing dielectric breakdown. The ability to drive pass gate 18 at 1.04 V instead of 1.0 V may result in at least 30% increase in on current performance (e.g., Idpg can be improved by at least 30% if overdriven by an additional 40 mV).

The transistor arrangement of the type shown in FIGS. 4 and 5 are merely illustrative. If desired, any transistor on device 10 may be formed using multiple OD strips coupled in parallel, where each OD strip has the minimum OD width allowable by the current processing technology.

The foregoing is merely illustrative of the principles of this invention and various modifications can be made by those skilled in the art without departing from the scope and spirit of the invention.

The invention claimed is:

1. An integrated circuit, comprising:
a planar substrate;
isolation structures; and
a transistor that includes:
   at least three parallel doped semiconductor regions that are formed in the planar substrate, wherein the at least three parallel doped semiconductor regions form source-drain regions for the transistor, and wherein the isolation structures are interposed between the at least three parallel doped semiconductor regions;
   a gate structure that extends over the at least three parallel doped semiconductor regions and that includes a gate insulator layer that is formed over the substrate and that has a first thickness above an interface between one of the isolation structures and a given one of the at least three parallel doped semiconductor regions, and that has a second thickness over another region of the given doped semiconductor region, wherein the second thickness is less than the first thickness;
   a first metal conductor that shorts a first portion of the at least three parallel doped semiconductor regions; and
   a second metal conductor that shorts a second portion of the at least three parallel doped semiconductor regions.

2. The integrated circuit defined in claim 1, wherein the at least three parallel doped semiconductor regions comprise at least four parallel doped semiconductor regions.

3. The integrated circuit defined in claim 1, wherein the transistor comprises a planar transistor.

4. The integrated circuit defined in claim 1, wherein at least two of the at least three parallel doped semiconductor regions are separated by a distance, wherein at least one of the at least three parallel doped semiconductor regions has a width, and wherein the distance divided by the width is at least 0.4.

5. The integrated circuit defined in claim 1, wherein the at least three parallel doped semiconductor regions have different widths.

6. The integrated circuit defined in claim 1, wherein the at least three parallel doped semiconductor regions have identical widths.

7. Circuitry, comprising:
a substrate;
isolation structures; and
a planar transistor formed in the substrate, wherein the transistor comprises:
   at least three parallel doped regions formed in the substrate, wherein the isolation structures are formed between the at least three parallel doped regions;
   a gate conductor disposed over the at least three parallel doped regions, wherein two of the at least three parallel doped semiconductor regions are separated by a distance, and wherein at least one of the two parallel doped semiconductor regions has a width; and
   a gate insulator layer that is interposed between the gate conductor and the substrate, wherein the gate insulator layer has a first thickness over one of the isolation structures, wherein the gate insulator layer has a second thickness over one of the at least three parallel doped regions, and wherein the first thickness is greater than the second thickness.

8. The circuitry defined in claim 7, wherein the distance divided by the width is at least 0.4.

9. The circuitry defined in claim 7, wherein the distance divided by the width is at least 0.7.

10. The circuitry defined in claim 7, wherein the at least three parallel doped regions have identical widths.

11. The circuitry defined in claim 7, further comprising:
an additional gate conductor that is disposed over the at least three parallel doped regions and that is parallel to the gate conductor.

12. A transistor formed in a substrate, comprising:
a first doped region that is formed in the substrate;
a second doped region that is formed in the substrate and that is parallel to the first doped region, wherein the first and second doped regions have different widths;
an isolation structure formed between the first and second doped regions;
a third doped region that is formed in the substrate and that is parallel to the first doped region; and
a gate conductor that extends over the first, second, and third doped regions, wherein the gate conductor is formed at a first distance from the first doped region, wherein the gate conductor is formed at a second distance from the isolation structure, and wherein the second distance is greater than the first distance.

13. The transistor defined in claim 12, wherein the substrate comprises a planar substrate.

14. The transistor defined in claim 12, further comprising:
at least one conductive path that shorts the first and second doped regions.

15. The transistor defined in claim 12, further comprising:
shallow trench isolation structures interposed between the first and second doped regions.

16. The circuitry defined in claim 7, wherein the gate conductor in the transistor is a non-planar gate conductor.

17. The transistor defined in claim 12, further comprising:
a gate insulator that is formed on the surface of the substrate, wherein the gate insulator has a first thickness over the first doped region and a second thickness over the isolation structure that is greater than the first thickness.

* * * * *